United States Patent [19]

Tanba et al.

[11] Patent Number: 5,026,654
[45] Date of Patent: Jun. 25, 1991

[54] METHOD OF MANUFACTURING A SEMICONDUCTOR DEVICE UTILIZING A SINGLE POLYCRYSTALLINE LAYER FOR ALL ELECTRODES

[75] Inventors: Nobuo Tanba, Ohme; Takahide Ikeda, Tokorozawa, both of Japan

[73] Assignee: Hitachi, Ltd., Tokyo, Japan

[21] Appl. No.: 159,925

[22] Filed: Feb. 24, 1988

[30] Foreign Application Priority Data

Mar. 27, 1987 [JP] Japan ............................ 62-71438

[51] Int. Cl.$^5$ ............................................. H01L 21/265
[52] U.S. Cl. ....................................... 437/31; 437/34; 437/57; 357/43; 357/59
[58] Field of Search ............... 437/31, 34, 57; 357/43, 357/59 H, 59 I

[56] References Cited

U.S. PATENT DOCUMENTS

| | | | |
|---|---|---|---|
| 4,319,932 | 3/1982 | Jambotkar | 357/59 H |
| 4,503,603 | 3/1985 | Blossfeld | 437/59 |
| 4,752,529 | 6/1988 | Schaber | 437/31 |
| 4,808,548 | 2/1989 | Thomas et al. | 357/43 |

FOREIGN PATENT DOCUMENTS

| | | | |
|---|---|---|---|
| 2153146 | 8/1985 | United Kingdom | 437/57 |
| 2173638 | 10/1986 | United Kingdom | 437/56 |

Primary Examiner—Brian E. Hearn
Assistant Examiner—Laura M. Holtzman
Attorney, Agent, or Firm—Antonelli, Terry, Stout & Kraus

[57] ABSTRACT

Disclosed is here a semiconductor integrated circuit device and a method of manufacturing the same in which bipolar transistors and MISFETs are formed on a semiconductor substrate. Emitter and base electrodes of the bipolar transistors and gate, source, and drain electrodes of the MISFETs are constituted with the same polycrystalline layer, thereby realizing a high integration and a high-speed operation of a Bi-CMOS device.

17 Claims, 3 Drawing Sheets

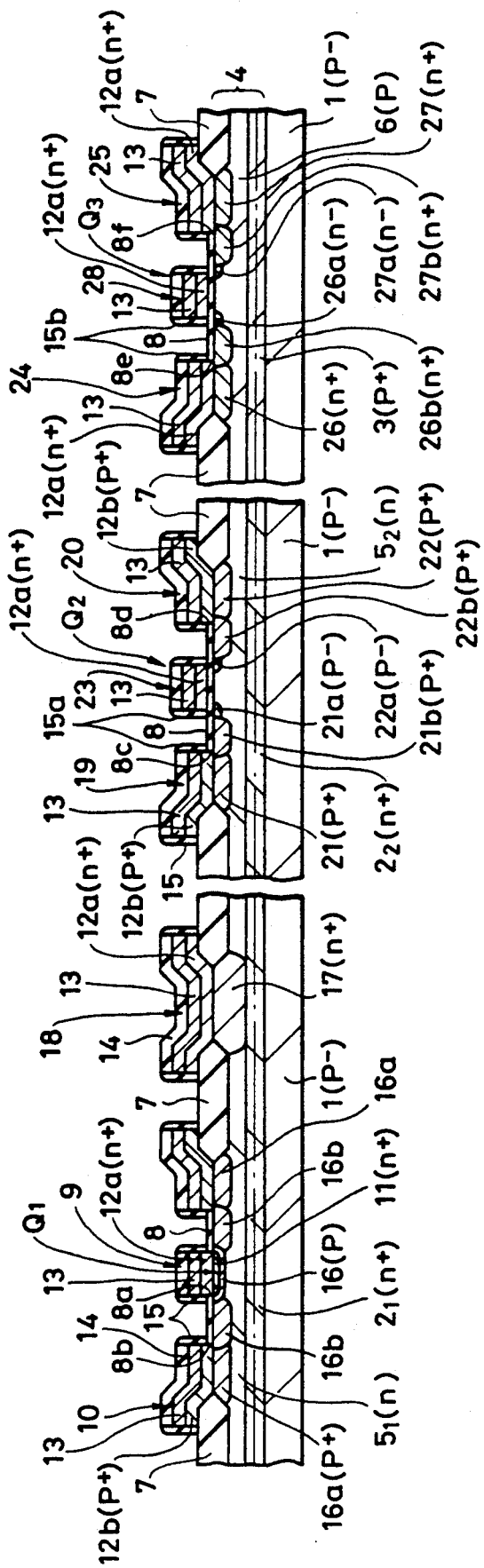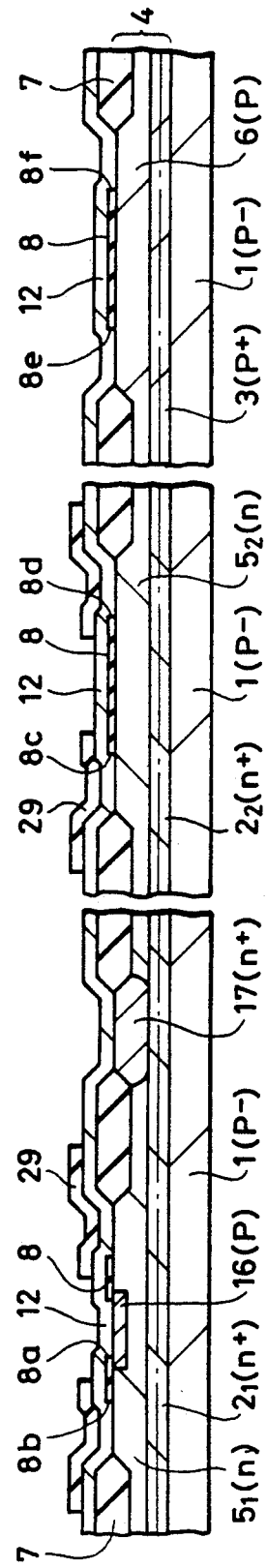
FIG. 2
FIG. 3

METHOD OF MANUFACTURING A SEMICONDUCTOR DEVICE UTILIZING A SINGLE POLYCRYSTALLINE LAYER FOR ALL ELECTRODES

BACKGROUND OF THE INVENTION

1. Technical Field of the Invention

The present invention relates to a semiconductor integrated circuit device and a manufacturing method of the same, and in particular, to a technology to be effectively applied to a semiconductor integrated circuit device (Bipolar Complementary Metal Oxide Semiconductor LSI to be simply referred to as bipolar CMOS LSI herebelow) including bipolar transistors and MISFETs on a substrate thereof.

2. Description of the Prior Art

Conventionally, a bipolar CMOS LSI is described, for example, in the Digest of Technical Papers of IEDM 1985, pp. 423-426.

In this bipolar CMOS LSI, on an epitaxial layer formed on a semiconductor substrate, there is arranged a thick field insulation layer for separating device elements according to the known selective oxidation method, thereby providing an area for disposing a bipolar transistor and an area for arranging a MISFET. On surfaces of activation areas enclosed with the field insulation layer, there is formed a thin insulation film. Thereafter, a first polycrystalline silicon layer is formed on the entire surface of the semiconductor substrate and is then a patterning operation is achieved thereon so as to dispose gate electrodes of the MISFETs in predetermined areas, and next, an ion bombardment to implant a p-type impurity substance is effected to form base regions of the bipolar transistors. Subsequently, source and drain regions of the n-channel and p-channel MISFETs are established by the ion bombardment of n-type and p-type impurity substances, respectively. In the impurity ion bombardment to dispose the source and drain regions of the p-channel MISFETs, graft base regions of the bipolar transistors are also formed by use of a predetermined mask. Thereafter, in order to provide emitter regions of the bipolar transistors, portions of the thin insulation film are removed through an etching operation and then a second polycrystalline silicon layer is disposed on the entire surface of the semiconductor substrate. Subsequently, for example, arsenic is doped into the second polycrystalline silicon layer, which then undergoes a patterning such that only portions corresponding to the emitter regions to be disposed are remained. Thereafter, an annealing operation is effected in the state above, which causes the arsenic in the second polycrystalline silicon layer to be diffused into the epitaxial layer, thereby establishing the emitter regions in the base regions. The polycrystalline silicon layer in the emitter regions is kept so as to be used as emitter electrodes. Next, an insulation layer is formed for passivation on the overall surface of the semiconductor substrate, contact holes are established in the insulation layer, and an aluminum film is applied on the entire surface. Thereafter, the aluminum film undergoes a patterning so as to form aluminum electrodes for the emitters, bases, and collectors of the bipolar transistors and aluminum electrodes for the source and drain regions of the MISFETs.

SUMMARY OF THE INVENTION

The conventional bipolar CMOS LSI described above, however, is attended with the following problems. That is, in the bipolar transistor, since a large margin must be allocated for matching the masks of the emitter and graft base regions, the device element area of the bipolar transistors becomes to be great. Consequently, the high integration of the LSI is difficult; moreover, since there appear a high base resistance and a large parasitic capacitance between the collector and the substrate as well as between the base and the collector, a sufficient high-speed operation cannot be developed.

It is therefore an object of the present invention to provide a technology which enables, in a semiconductor integrated circuit device including bipolar transistors and MISFETs, the device area of the bipolar transistors to be reduced.

Another object of the present invention is to provide a technology which enables, in a semiconductor integrated circuit device including bipolar transistors and MISFETs, the operation speed of the bipolar transistors to be increased.

The objects and other objects as well as the novel features of the present invention will be apparent from the following detailed description taken in conjunction with the accompanying drawings.

Of the invention disclosed in this specification, the representative features can be briefly described as follows.

Namely, in the first invention, the emitter and base electrodes of the bipolar transistors are constituted with the same polycrystalline silicon film in which p-type and n-type impurities are implanted into arbitrary regions thereof. Furthermore, there are disposed side walls made of insulation layers as side walls of the emitter and base electrodes, and on a surface of the semiconductor substrate between the emitter and base electrodes defined by the side walls, there are disposed second graft base regions electrically connecting the first graft base regions and intrinsic base regions.

Furthermore, the second invention includes a step for establishing an insulation film partially having openings on a surface of an epitaxial layer disposed on the semiconductor substrate, a step for forming a polycrystalline silicon layer on an entire surface, a step for selectively implanting p-type and n-type impurity substances in the polycrystalline silicon layer, a step for patterning the polycrystalline silicon film so as to simultaneously form at least the emitter and base electrodes of the bipolar transistors, a step for establishing side walls of insulation films as side walls of the emitter and base electrodes, and a step for implanting an impurity substance with a mask constituted with the emitter and base electrodes and the side walls.

Accordinq to the means of the first invention, the diffusion of n-type and p-type impurity substances through the polycrystalline silicon film enables the emitter regions and the graft base regions to be established for the emitter and base electrodes in a self-aligning fashion; consequently, the margin conventionally required for matching masks between the emitter and graft base regions becomes to be unnecessitated and hence the base regions can be accordingly reduced. In addition, the base resistance and the parasitic capacitance between the collector and the substrate and between the base and the collector is lowered. As a result, the device element area of each bipolar transistor can be minimized and a satisfactory high-speed operation thereof is attained. Moreover, since the emitter and base electrodes are constituted with the same polycrystalline silicon layer, there is no increase in the number of process steps.

Furthermore, the second graft base regions enable the emitter and first graft base areas or regions to be highly resistive against a high voltage therebetween.

In addition, according to the means of the second invention, since the diffusion of impurity substances through the polycrystalline silicon film, the emitter regions and the graft base regions can be established for the emitter and base electrodes in a self-aligning fashion; consequently, the margin conventionally required for matching masks between the emitter and graft base regions becomes to be unnecessitated and hence the base regions can be accordingly reduced; moreover, the base resistance and the parasitic capacitance between the collector and the substrate and between the base and the collector are minimized. As a result, the device element area of each bipolar transistor can be reduced and a satisfactory high-speed operation thereof is attained without increasing the number of process steps.

Furthermore, the side walls formed at the sides of the base and emitter electrodes enable the second graft base regions to be established so as to electrically connect the first graft base regions to the intrinsic base regions in a self-aligning fashion; consequently, by adjusting the impurity concentration of the second graft base region, the voltage which can be applied between the emitter and first graft regions can be arbitrarily adjusted.

BRIEF DESCRIPTION OF THE DRAWINGS

The present invention will be apparent from the following detailed description taken in conjunction with the accompanying drawings in which:

FIG. 2 is a cross-sectional diagram of the bipolar CMOS LSI of FIG. 1 along a line X—X; and FIGS. 3–5 are cross-sectional diagrams useful to explain a method of manufacturing the bipolar CMOS LSI of FIGS. 1–2.

DETAILED DESCRIPTION OF THE PREFERRED EMBODIMENTS

Figure 1:
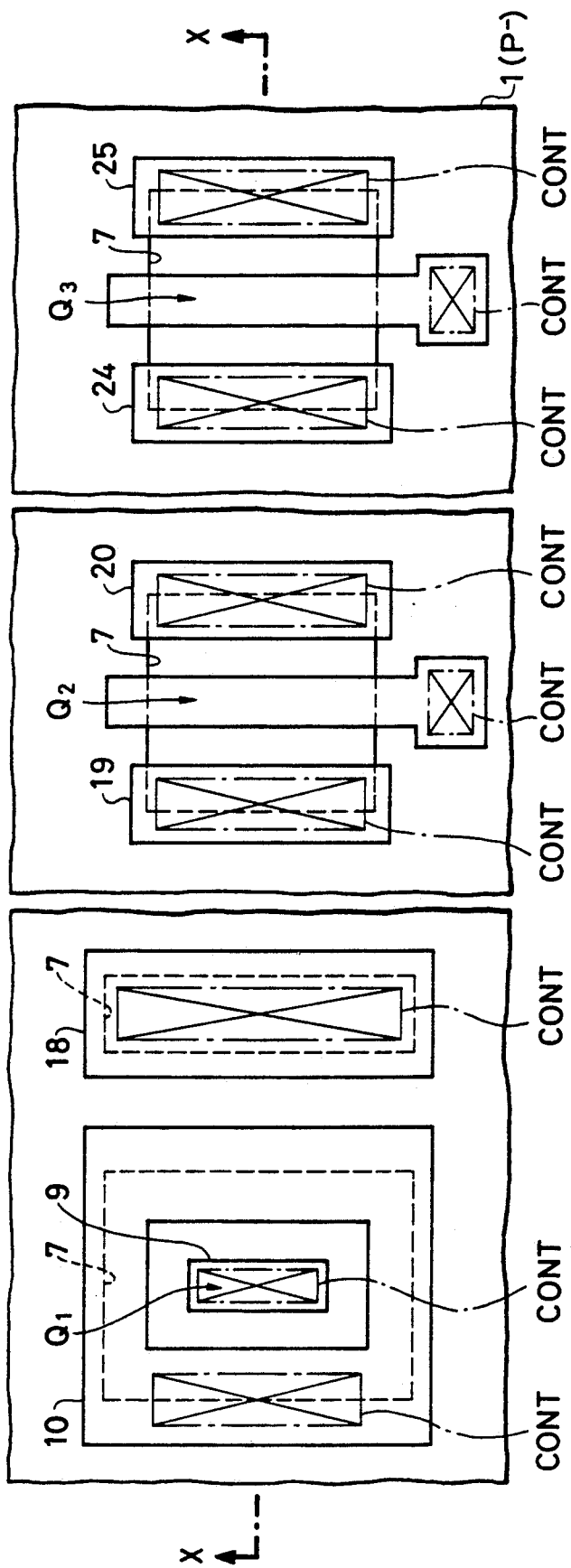
FIG. 1 is a plan view schematically showing a bipolar CMOS LSI as an embodiment according to the present invention.

Referring now to the drawings, description will be given of an embodiment according to the present invention.

Incidentally, in the drawings for the explanation of the embodiments, the components having the same functions are assigned with the same reference numerals and the redundant description thereof will be omitted.

FIG. 1 is a plan view schematically showing a bipolar CMOS LSI as an embodiment according to the present invention and FIG. 2 is a cross-sectional diagram of the bipolar CMOS LSI of FIG. 1 along a line X—X.

As shown in FIGS. 1-2, in the bipolar CMOS LSI as an embodiment, for example, $n^+$-type buried layers $2_1$–$2_2$ and $p^+$-type buried layer 3 are disposed in a semiconductor substrate 1 made of, for example, a $p^-$-type silicon substrate, and for example, an epitaxial layer 4 made of a silicon film is formed on the semiconductor substrate 1. Incidentally, the surface of the semiconductor substrate 1 prior to growth of the epitaxial layer 4 is indicated by use of a dot-and-dash line in FIG. 2. In the epitaxial layer 4, there are disposed, for example, n-type wells $5_1$–$5_2$ and a p-type well 6 corresponding to the buried layers $2_1$–$2_2$ and the buried layer 3, respectively.

On the surface of the epitaxial layer 4, there is selectively disposed a field insulation layer 7, for example, made of an $SiO_2$ film, thereby separating the device elements. On the surfaces of the n-type wells $5_1$–$5_2$ and the p-type well 6 in the portions enclosed with the field insulation layer 7, there is disposed an insulation layer 8 made of, for example, an $SiO_2$ film. Openings 8a–8b are formed in the insulation film 8 located on the surface of the n type well 5. Through these openings 8a–8b, an emitter electrode 9 and a base electrode 10 are respectively disposed in, for example, an $n^+$-type emitter region 11 and a $p^+$-type first graft base region 16a formed in the n-type well $5_1$. The emitter electrode 9 is constituted with, for example, an $n^+$-type polycrystalline silicon layer 12a and a refractory metal silicide film 13, for example, made of a tungsten silicide ($WSi_2$) or a molybdenum silicide ($MoSi_2$). Furthermore, the base electrode 10 is constituted with, for example, a $p^+$-type polycrystalline silicon layer 12b and the refractory metal silicide layer 13. The emitter electrode 9 and base electrode 10 are, together with the collector electrode 18, gate electrodes 23 and 28, source electrodes 19 and 24, and drain electrodes 20 and 25 which will be described later in this specification, simultaneously formed through a patterning operation by use of the same polycrystalline silicon layer 12 and the refractory metal silicide layer 13. In addition, the emitter region 11 is formed for the emitter electrode 9 in a self-aligning fashion through a diffusion of an impurity substance such as arsenic from the $n^+$-type polycrystalline silicon layer 12a constituting the emitter electrode 9. Furthermore, the graft base region 16a is established through a diffusion of an impurity substance such as boron from the $p^+$-type polycrystalline silicon layer 12b constituting the base electrode 10, and the other graft base region (linking base region or a second graft base region) 16b is formed for the emitter electrode 9, the base electrode 10, and the side walls 5 in a self-aligning fashion through an ion bombardment of an impurity substance by using as a mask the emitter electrode 9, the base electrode 10, and the side walls 15. The second base region (linking base) 16b functions to electrically connect the first graft base region 16a to the intrinsic base region 16. Since an electric connection between the first graft base region 16a and a wiring such as an aluminum wiring transmitting an external electric signal can be established via the base electrode 10, the conventional process to form an aluminum electrode in the graft region so as to dispose a contact hole in the insulation layer disposed on the graft base tensions to establish an electric connection is unnecessitated. As a result, the margin for the mask matching with respect to the contact hole, the intrinsic base region, and the emitter electrode need not be taken into consideration, and hence the dimension of the device can be accordingly reduced. Consequently, a higher integration is possible due to the reduction of the device element area; furthermore, the parasitic capacitance between the semiconductor substrate 1 and the collector region which will be described later in this specification and that between the collector region and the first graft base region 16a as well as the intrinsic base region 16 can be minimized, thereby increasing the operation speed of the LSI. Incidentally, reference numeral 14 indicates an insulation layer made of, for example, an $SiO_2$ film, whereas reference numeral 15 indicates a side wall constituted with an insulating substance, for example, SiO$_2$. Furthermore, the emitter region 11 is disposed, for example, in the intrinsic base region 16 electrically connected to the graft base region 16a via the second graft (linking base) region 16b. The emitter region 11, the intrinsic base region 16, and the collector region including the n-type well 5$_1$ below the intrinsic base region 16 constitute an npn-type bipolar transistor Q$_1$. Incidentally, reference numeral 17 denotes, for example, an n+-type collector drawing region connected to the buried layer 2$_1$. On the collector drawing region 17, like the emitter electrode 9, there is disposed a collector electrode 18 including, for example, an n+-type polycrystalline silicon layer 12a and the refractory metal silicide layer 13. Incidentally, without disposing the collector electrode 18, the device may be structured such that a wiring, for example, an aluminum wiring is directly connected to the collector drawing region 17.

On the other hand, openings 8c-8d are disposed in the insulation layer 8 disposed on the surface of the n-type well 5$_2$. Through the openings 8c-8d, a source electrode 19 and a drain electrode 20 are respectively disposed, for example, on the p+-type source region 21 and drain region 22 disposed in the n-type well 5$_2$. The source electrode 19 and the drain electrode 20 are constituted, like the base electrode 10, with for example, the p+-type polycrystalline silicon layer 12b and the refractory metal silicide layer 13. Furthermore, on the insulation layer 8, like the emitter electrode 9, there is disposed a gate electrode 23 constituted with, for example, the n+-type polycrystalline silicon layer 12a and the refractory metal silicide layer 13. The source region 21 and the drain region 22 are configured in a self-aligning fashion with respect to the gate electrode 23. Moreover, of the source region 21 and the drain region 22, portions adjacent to the source electrode 19 and the drain electrode 20 are established through a diffusion of an impurity substance through the p+-type polycrystalline silicone layer 12b constituting the source electrode 19 and the drain electrode 20. Furthermore, on the surface of the semiconductor substrate between the gate electrode, the source electrode, and the drain electrode defined by the side walls 15a made of the insulation layer (SiO$_2$) disposed at the sides of the source and drain electrodes, there are disposed p+-type impurity regions 21b and 22b constituting portions of the source and drain regions. Consequently, the gate electrode 23, the source region 21, the p+-type impurity region 21b, the drain region 22, and the p+-type impurity region 22b form a p-channel MOSFET (MISFET) Q$_2$. In a lower portion at an end of the gate electrode 23, there are disposed, for example, p−-type regions 21a and 22a having a low impurity concentration. The regions 21a and 22a having a low impurity concentration are established through an ion bombardment by using as a mask for implanting an impurity substance the gate electrode 23 and the source and drain electrodes 19-20. In the p-channel MOSFET Q$_2$, the electric field in the proximity of the drain region 22 can be lowered by use of the regions 21a and 22a having a low impurity concentration, namely, the MOSFET Q$_2$ has a so-called Lightly Doped Drain (LDD) structure.

In the insulation layer 3 located on the surface of the p-type well 6, there are disposed openings 8e-8f. Through these openings 8e-8f, the source electrode 24 and the drain electrode 25 are respectively established, for example, on the n+-type source region 26 and drain region 27. In addition, a gate electrode 28 is arranged on the insulation layer 8. The gate electrode 28, the source electrode 24, and the drain electrode 25, like the emitter electrode 9 described above, are constituted with, for example, an n+-type polycrystalline silicon layer 12a and the refractory metal silicide layer 13. The source region 26 and the drain region 27 are disposed in a self-aligning fashion with respect to the gate electrode 28. Furthermore, like the p-channel MOSFET Q$_2$, there are also disposed side walls 15b and n+-type impurity regions 26b and 27b. The gate electrode 28, the source region 26, the n+-type impurity region 26b, the drain region 27, and the n+-type impurity region 27b form an n-channel MOSFET (MISFET) Q$_3$. In portions of the source region 26 and the drain region 27, the portions being below an end portion of the gate electrode 28, there are disposed, for example, n−-type impurity regions 26a and 27a having a low impurity concentration. Consequently, like the p-channel MOSFET Q$_2$, the regions 26a and 27a having a low impurity concentration enable the LDD structure to be established so as to lower the electric field in the neighborhood of the drain region 27. The n-channel MOSFET Q$_3$ and the p-channel MOSFET Q$_2$ constitute a CMOS (complementary MOSFET).

As described above, since the source electrodes 19 and 24 and drain electrodes 20 and 25 are simultaneously formed together with the emitter electrode 9 and the base electrode 10, the source electrodes 19 and 24 and drain electrodes 20 and 25 do not cause the number of manufacturing steps to be increased. Furthermore, in order to electrically connect the source electrodes 19 and 24 and the drain electrodes 20 and 25 to the source regions 21 and 26 and the drain regions 22 and 27, respectively, there are not directly disposed contact holes, which are conventionally used, on the source regions 21 and 26 and the drain regions 22 and 27, which unnecessitates, as compared with the prior art technology, the margin for the mask matching with respect to the contact holes, the gate electrodes 23 and 28, and the field insulation layer 7, thereby accordingly minimizing the dimension of the device. As a consequence, due to the reduction of the device element areas of the p-channel MOSFET Q$_2$ and the n-channel MOSFET Q$_3$, a higher integration of the device is realized; furthermore, the parasitic capacitance between the source regions 21 and 21a as well as the drain regions 22 and 22b and the n-type well 5$_2$ and the parasitic capacitance between the source region 26 and the drain region 27 are lowered so as to increase the operation speed.

Incidentally, in place of the refractory metal silicide layer 13, there may be used a refractory metal layer, for example, made of tungsten, molybdenum, or the like. In addition, the emitter electrode 9, the base electrode 10, the collector electrode 18, the source electrodes 19 and 24, the drain electrodes 20 and 25, and the gate electrodes 23 and 28 may be constituted, for example, only with n+-type or p+-type polycrystalline silicon layers. Furthermore, in order to adjust the threshold voltages of the p-channel MOSFET Q$_2$ and the n-channel MOSFET Q$_3$, a p+-type polycrystalline silicon layer 12b may be used in place of the n+-type polycrystalline silicon layer 12b constituting the gate electrodes 23 and 28.

Next, a description will be given of an example of a method of manufacturing a bipolar CMOS LSI according to the embodiment configured as described above.

As shown in FIG. 3, first, n+-type buried layers $2_1$, $2_2$ and p+-type buried layer 3 are respectively formed in a surface of a p−-type semiconductor substrate 1 through a selective ion bombardment of impurity substances and a diffusion thereof. As the impurity substances, there are used, for example, arsenic (As), antimony (Sb), and boron (B). On the semiconductor substrate 1, an epitaxial layer 4 made of silicon is disposed, for example, by use of an epitaxial growth method. Subsequently, for example, n-type and p-type impurity substances are implanted through a selective ion bombardment into the epitaxial layer 4 so as to form n-type wells $5_1$, $5_2$ and a p-type well 6. The surface of the epitaxial layer 4 is then subjected to a selective thermal oxidation to respectively establish a field insulation layer 7 on the surface of the epitaxial layer 4. Thereafter, a selective ion bombardment of an n-type impurity substance such as phosphorus is effected into the n-type well $5_1$ so as to establish a collector drawing region 17, and then the workpiece of the device is annealed, for example, in an atmosphere of argon (Ar) at 950° C. for 30 minutes, which electrically activates the impurity substances. Subsequently, an ion bombardment of a p-type impurity substance such as boron is selectively achieved into the n-type well $5_1$ to establish an intrinsic base region 16. Surfaces of the n-type wells $5_1$, $5_2$ and the p-type well 6 enclosed with the field insulation layer 7 are thereafter, for example, thermally oxidized so as to form an insulation layer 8. Predetermined portions of the insulation layer 8 are next removed through an etching to dispose openings 8a-8f. Subsequently, a polycrystalline silicon layer 12 having a thickness of, for example, 1500 Å is formed on an entire surface by use of the CVD method, for example, and then an insulation layer 29 such as an $SiO_2$ layer is disposed on the polycrystalline silicon layer 12. The insulation layer 29 is patterned according to a predetermined shape. Next, by using the patterned insulation layer 29 as a mask, an ion bombardment of an n-type impurity substance such as arsenic is achieved on the polycrystalline silicon layer 12. Subsequently, an etching operation is effected on the insulation layer 29 and then an ion bombardment of a p-type impurity substance such as boron is accomplished in the entire surface of the polycrystalline layer 12. Incidentally, the ion bombardment of the p-type impurity substance is to be effected under conditions where a sufficient impurity concentration associated with the p-type impurity substance can be attained even after the impurity capture is achieved by the p-type impurity substance.

Figure 4:
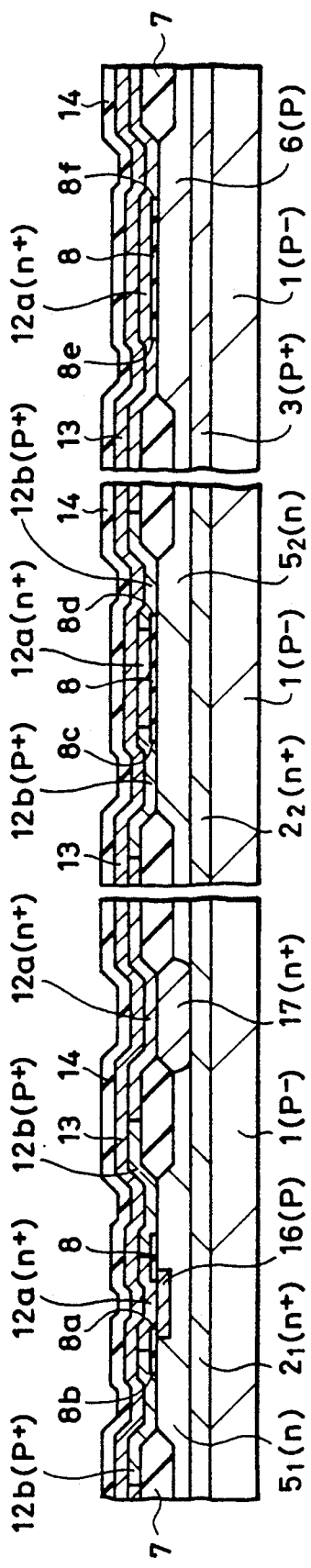

Through the process operations above, as shown in FIG. 4, there are formed an n+-type polycrystalline silicon layer 12a and a p+-type polycrystalline silicon layer 12b. Next, a refractory metal silicide layer 13 having a layer thickness, for example, of 1500 Å is formed on the entire surface, for example, by use of the sputtering method, and then an insulation layer 14 having a layer thickness of, for example, 1500 Å to 2000 Å is established on the refractory metal silicide layer 13.

Figure 5:
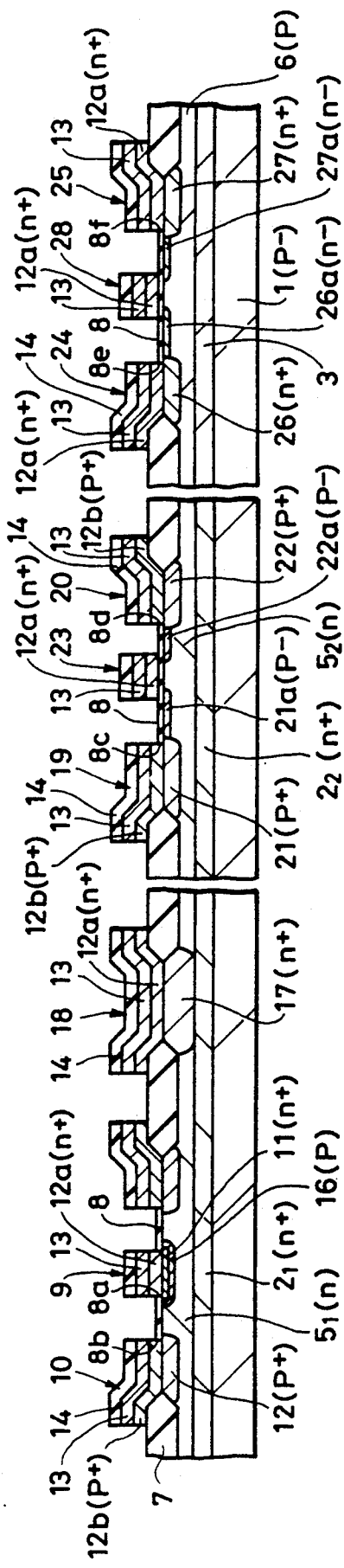

Thereafter, an anisotropic etching such as a reactive ion etching (RIE) is achieved on the insulation layer 1, the refractory metal silicide layer 13, and the polycrystalline silicon layer 12 so as to sequentially effect patterning processes, thereby establishing the emitter electrode 9, the base electrode 10, the collector electrode 18, the gate electrodes 23, 28, the source electrode 19, and the drain electrodes 20, 25 as shown in FIG. 5. As a result, these electrodes 9-10, 18-20, 23-25, and 28 can be formed at the same time. That is, these components can be constituted with the same conductive layer (a conductive layer formed in the same manufacturing process).

Next, a thermal processing is achieved to cause the n-type impurity substance or the p-type impurity substance contained in the polycrystalline silicon layers 12a and 12b constituting these electrodes 9-10, 19-20, and 24-25 to be diffused in the n-type wells $5_1$, $5_2$ and the p-type well 6 so as to establish the emitter region 11, the first graft base region 16a, the source regions 21 and 26, and the drain regions 22 and 27. Subsequently, by using the gate electrode 23 and the source and drain electrodes 19-20 as a mask, an ion bombardment of a p-type impurity substance such as boron is selectively accomplished on the n-type well $5_2$, thereby forming the impurity regions 21a and 22a having a low impurity concentration. Similarly, in the subsequent step, by using the gate electrode 28 and the source and drain electrodes 24-25 as a mask, an ion bombardment of an n-type impurity substance such as phosphorus is selectively accomplished on the p-type well 6a, thereby forming the impurity regions 26a and 27a having a low impurity concentration.

Next, as shown in FIG. 2, an insulation layer such as an $SiO_2$ layer is formed on the entire surface of the semiconductor substrate 1 and then an anisotropic etching is effected on the insulation layer in a direction orthogonal to the surface of the substrate 1, for example, by use of the RIE, thereby establishing side walls 15a and 15b at the sides of the emitter electrode 9, the base electrode 10, the collector electrode 18, the gate electrodes 23 and 28, the source electrodes 19 and 24, and the drain electrodes 20 and 25. Thereafter, by using the side walls 15a and 15b, the base electrode 10, the source and drain electrodes 19-20 and 24-25 as respective masks for the bombardment of impurity substances, an ion bombardment is selectively effected to implant a p-type impurity substance such as boron in the n-type wells $5_1$ and $5_2$ and an n-type impurity substance such as phosphorus in the p-type well 6, thereby forming the second graft base (linking base) region 16b and the p+-type impurity regions 21b and 22b and the n+-type impurity regions 26b and 27b respectively constituting portions of the source and drain regions.

Next, an insulation layer such as a PSG layer (not shown) for passivation is arranged on the entire surface and then, as shown in FIG. 1, contact holes CONT are formed in the passivation insulating layer and the insulation layer 14 on the respective electrodes. A wiring layer, for example, an aluminum layer is formed on the entire surface and is then etched so as to accomplish a patterning for establishing a predetermined wiring (not shown). The respective electrodes are connected to the aluminum wiring through the contact holes CONT. Through these processes, an objective bipolar CMOS LSI is completely manufactured.

While the present invention has been concretely described with reference to the particular illustrative embodiments, it is not to be restricted by those embodiments. It is to be appreciated that the embodiments can be changed and modified within the scope and spirit of the present invention.

For example, the present invention can be applied to various LSIs including a static random access memory (RAM), a dynamic RAM, and a gate array respectively using the bipolar CMOS.

The effects obtained by the representative features of the present invention disclosed in this specification are as follows.

That is, according to the first invention, the device element area of the bipolar transistors can be reduced and at the same time the operation speed thereof can be sufficiently increased.

In addition, according to the second invention, without increasing the number of manufacturing steps, the device element area of the bipolar transistors can be reduced and at the same time the operation speed thereof can be sufficiently increased.

What is claimed is:

1. A method of manufacturing a semiconductor integrated circuit device having at least one bipolar transistor comprising the steps of:
    (a) providing a semiconductor substrate having a main surface;
    (b) introducing impurities of a first conductivity type into said substrate to form an intrinsic base region of said bipolar transistor;
    (c) forming a polycrystalline silicon film over said main surface, said polycrystalline silicon film being formed so as to connect to at least a portion of said intrinsic base region and a portion of said main surface which surrounds said intrinsic base region;
    (d) introducing impurities of a second conductivity type opposite to said first conductivity type into said polycrystalline silicon film over said intrinsic base region, and introducing impurities of said first conductivity type into said polycrystalline silicon film;
    (e) patterning said polycrystalline silicon film, thereby simultaneously forming a first polycrystalline silicon film part of said second conductivity type on said intrinsic base region and a second polycrystalline silicon film part of said first conductivity type on the portion of said main surface which surrounds said intrinsic base region, the first and second polycrystalline silicon film parts being spaced from each other, said first and second polycrystalline silicon film parts serving as an emitter lead-out electrode and a base lead-out electrode of said bipolar transistor;
    (f) diffusing said impurities introduced in said first and second polycrystalline silicon film parts into said intrinsic base region and the portion of said main surface which surrounds said intrinsic base region, thereby respectively forming an emitter region in said intrinsic base region and an extrinsic base region in said main surface, of said bipolar transistor; and
    (g) introducing impurities of said first conductivity type into said main surface using said first and second polycrystalline silicon film parts as a mask, thereby forming a linking base region of said bipolar transistor so as to electrically connect said intrinsic base region with said extrinsic base region.

2. A method of manufacturing a semiconductor integrated circuit device according to claim 1 wherein said semiconductor integrated circuit device also includes MISFETs, and wherein said patterning said polycrystalline silicon layer also simultaneously forms at least source electrodes and drain electrodes of said MISFETs.

3. A method of manufacturing a semiconductor integrated circuit device according to claim 2, wherein each said bipolar transistor is an npn-type bipolar transistor and said MISFETs include complementary MISFETs including an n-channel MISFET and a p-channel MISFET.

4. A method of manufacturing a semiconductor integrated circuit device according to claim 3 wherein
    said base electrodes of said bipolar transistors and said source electrodes and said drain electrodes of said p-channel MISFETs include said polycrystalline silicon layer rendered to be of a p type and
    said emitter electrodes of said bipolar transistors and said source electrodes and said drain electrodes of said n-channel MISFETs include said polycrystalline silicon layer rendered to be of an n type.

5. A method of manufacturing a semiconductor integrated circuit device according to claim 4 wherein
    at least portions of emitter regions of said bipolar transistors and at least portions of source regions and of drain regions of said n-channel MISFETs are formed through a diffusion of an n-type impurity substance from said n-type polycrystalline silicon layer and
    at least portions of extrinsic base regions of said bipolar transistor and at least portions of source regions and of drain regions of said p-channel MISFETs are constituted through a diffusion of a p-type impurity substance from said p-type polycrystalline silicon layer.

6. A method of manufacturing a semiconductor integrated circuit device according to claim 5 wherein said patterning of said polycrystalline silicon layer simultaneously forms a gate electrode of each of said MISFETs.

7. A method of manufacturing a semiconductor integrated circuit device according to claim 6 wherein a refractory metal layer or a refractory metal silicide layer is disposed on said polycrystalline silicon layer.

8. A method of manufacturing a semiconductor integrated circuit device according to claim 1 wherein the patterning is performed by etching the polycrystalline silicon film so as to simultaneously form the first and second polycrystalline silicon film parts.

9. A method of manufacturing a semiconductor integrated circuit device having at least one bipolar transistor, comprising the steps of:
    (a) forming a polycrystalline silicon film over a main surface of a semiconductor substrate, said semiconductor substrate having an intrinsic base region for the bipolar transistor, said intrinsic base region being of a first conductivity type;
    (b) introducing impurities of a second conductivity type opposite to the first conductivity type into the polycrystalline silicon film over said intrinsic base region, and also introducing impurities of the first conductivity type into said polycrystalline silicon film;
    (c) patterning said polycrystalline silicon film, thereby simultaneously forming a first polycrystalline silicon film part of said second conductivity type, and a second polycrystalline silicon film part of said first conductivity type, the first and second polycrystalline silicon film parts being spaced from each other, the first and second polycrystalline silicon film parts respectively to be electrically connected to an emitter region and a base region of said bipolar transistor;
    (d) diffusing the impurities introduced in the first and second polycrystalline silicon film parts into the intrinsic base region and into the semiconductor substrate, respectively, so as to respectively form an emitter region and an extrinsic base region of the bipolar transistor, the intrinsic and extrinsic base regions being spaced from each other; and (e) introducing impurities of said first conductivity type into said main surface using said first and second polycrystalline silicon film parts as a mask, thereby forming a linking base region of said bipolar transistor so as to electrically connect said intrinsic base region with said extrinsic base region.

10. A method of manufacturing a semiconductor integrated circuit device according to claim 9 wherein the first and second polycrystalline silicon film parts respectively form an emitter lead-out electrode and a base lead-out electrode of the bipolar transistor.

11. A method of manufacturing a semiconductor integrated circuit device according to claim 9 wherein the impurities of second conductivity type are selectively introduced, and the impurities of first conductivity type are introduced such that the first and second polycrystalline silicon film parts respectively of second and first conductivity type are formed by said patterning.

12. A method of manufacturing a semiconductor integrated circuit device according to claim 9 including a further step of forming a metal silicide layer on the polycrystalline silicon film, and wherein during the patterning the metal silicide layer is patterned so as to have remaining parts overlying the first and second polycrystalline silicon film parts.

13. A method of manufacturing a semiconductor integrated circuit device according to claim 9 wherein said patterning is performed by reactive ion etching.

14. A method of manufacturing a semiconductor integrated circuit device according to claim 9 wherein, after said patterning, sidewall oxide films are formed at sides of the first and second polycrystalline silicon film parts.

15. A method of manufacturing a semiconductor integrated circuit device according to claim 14 wherein said sidewall oxide films are formed by forming an oxide film on the patterned polycrystalline silicon film and anisotropically etching the oxide film so as to form the sidewall oxide films.

16. A method of manufacturing a semiconductor integrated circuit device having at least one bipolar transistor, comprising the steps of:

(a) introducing impurities of a first conductivity type into a semiconductor substrate to form an intrinsic base region of said bipolar transistor;

(b) forming a single patterned polycrystalline silicon film having a first polycrystalline silicon film part and a second polycrystalline silicon film part, the first polycrystalline silicon film part being provided on the intrinsic base region and being of the second conductivity type, the second conductivity type being opposite the first conductivity type, the second polycrystalline silicon film part being provided on a portion of the semiconductor substrate surrounding the intrinsic base region and spaced therefrom, said second polycrystalline silicon film part being of the first conductivity type;

(c) introducing impurities of said first conductivity type into a portion of the semiconductor substrate surrounding the intrinsic base region and spaced therefrom, so as to form an extrinsic base region of the bipolar transistor; and (d) in a separate step from the steps of introducing impurities to form the intrinsic base region and the extrinsic base region, introducing impurities of the first conductivity type into the semiconductor substrate to thereby form a linking base region so as to electrically connect said intrinsic base region with said extrinsic base region, wherein the impurities introduced to form the extrinsic base region are introduced by diffusion from said second polycrystalline silicon film part, said second polycrystalline silicon film part forming a part of a mask for introducing the impurities for forming the linking base region.

17. A method of manufacturing a semiconducting integrated circuit device according to claim 16, including the further steps of forming an emitter region in the intrinsic base region by introducing impurities of the second conductivity type into the intrinsic base region from the first polycrystalline silicon film part, the first polycrystalline silicon film part forming an emitter leading-out electrode on the emitter region, and wherein the emitter leading-out electrode is part of a mask for introducing the impurities for forming the linking base region.

* * * * *